(12) United States Patent
Fan et al.

(10) Patent No.: US 6,781,242 B1
(45) Date of Patent: Aug. 24, 2004

(54) THIN BALL GRID ARRAY PACKAGE

(75) Inventors: Chun Ho Fan, Sham Tseng (HK); Kwok Cheung Tsang, Fanling (HK); William Lap Keung Chow, Kowloon (HK)

(73) Assignee: ASAT, Ltd., New Territories (HK)

( * ) Notice: Subject to any disclaimer, the term of this patent is extended or adjusted under 35 U.S.C. 154(b) by 0 days.

(21) Appl. No.: 10/307,279

(22) Filed: Dec. 2, 2002

(51) Int. Cl.⁷ .................... H01L 23/48; H01L 29/40; H01L 23/52
(52) U.S. Cl. ............................. 257/777; 257/678
(58) Field of Search ........................ 257/737, 738, 257/734, 706, 678, 666, 668, 675, 777, 787, 796

(56) References Cited

U.S. PATENT DOCUMENTS

| | | | | |
|---|---|---|---|---|
| 5,910,686 A | * | 6/1999 | Hanzehdoost et al. | 257/778 |
| 6,175,497 B1 | * | 1/2001 | Tseng et al. | 361/704 |
| 6,184,580 B1 | * | 2/2001 | Lin | 257/712 |
| 6,373,131 B1 | * | 4/2002 | Karnezos | 257/712 |
| 6,414,849 B1 | * | 7/2002 | Chiu | 361/760 |
| 6,537,848 B2 | * | 3/2003 | Camenforte et al. | 438/106 |

* cited by examiner

Primary Examiner—David Nhu
(74) Attorney, Agent, or Firm—Keating & Bennett, llp (57) ABSTRACT

An integrated circuit package is provided. The package includes a substrate having first and second surfaces and a plurality of conductive traces therebetween. The substrate further has a cavity therein and a heat slug is fixed to the substrate and spans the cavity. A semiconductor die is mounted to the heat slug such that at least a portion of the semiconductor die is disposed in the cavity. A plurality of wire bonds connect the semiconductor die to ones of the conductive traces of the substrate and an encapsulating material encapsulates the wire bonds and the semiconductor die. A ball grid array is disposed on the first surface of the substrate. Bumps of the ball grid array are in electrical connection with ones of the conductive traces.

12 Claims, 14 Drawing Sheets

THIN BALL GRID ARRAY PACKAGE

FIELD OF THE INVENTION

The present invention relates in general to integrated circuit packaging, and more particularly to an improved ball grid array package with low profile and improved thermal and electrical properties.

BACKGROUND OF THE INVENTION

High performance integrated circuit (IC) packages are well known in the art. Improvements in IC packages are driven by industry demands for increased thermal and electrical performance and decreased size and cost of manufacture In general, array packaging such as Plastic Ball Grid Array (PBGA) packages provide a high density of interconnects relative to the surface area of the package. Typical PBGA packages include a substrate and a semiconductor die attached to the substrate by a die adhesive. Gold wire bonds electrically connect the die to metal traces on the substrate and the wire bonds and die are encapsulated in a molding material. Solder balls are disposed on the bottom surface of the substrate for signal transfer.

While these packages have been widely used, a reduction in package size is desirable in order to keep up with industry demands for decreased size. Also, typical PBGA packages include a convoluted signal path, giving rise to high impedance and an inefficient thermal path, resulting in poor thermal dissipation performance. With increasing package density, the spreading of heat generated by the device is increasingly important.

It is therefore an object of an aspect of the present invention to provide a thin ball grid array package with improved thermal and electrical performance, relative to conventional ball grid array packages.

SUMMARY OF THE INVENTION

In one aspect of the present invention, an integrated circuit package is provided. The package includes a substrate having first and second surfaces and a plurality of conductive traces therebetween. The substrate further has a cavity therein and a heat slug is fixed to the substrate and spans the cavity. A semiconductor die is mounted to the heat slug such that at least a portion of the semiconductor die is disposed in the cavity. A plurality of wire bonds connect the semiconductor die to ones of the conductive traces of the substrate and an encapsulating material encapsulates the wire bonds and the semiconductor die. A ball grid array is disposed on the first surface of the substrate. Bumps of the ball grid array are in electrical connection with ones of the conductive traces.

In another aspect of the present invention, there is provided a process for fabricating an integrated circuit package. The process includes: fixing a heat slug to a substrate having a cavity therein, such that the heat slug spans the cavity; mounting a semiconductor die to the heat slug, at least a portion of the semiconductor die being disposed in the cavity; wire bonding the semiconductor die to ones of conductive traces of the substrate; encapsulating the wire bonds and the semiconductor die in an encapsulating material; and forming a ball grid array on the a first surface of the substrate such that bumps of the ball grid array are in electrical connection with ones of the conductive traces.

In still another aspect of the present invention, an integrated circuit package is provided. The package has a substrate having a first ground on a first surface, a second ground on a second surface, conductive traces extending between the first surface and the second surface, and at least one conductive via extending between the first ground and the second ground. The substrate further has a cavity therein. A heat slug is fixed to the substrate and spans the cavity, such that the heat slug is connected to the first ground. A semiconductor die is mounted to the heat slug, at least a portion of the semiconductor die being disposed in the cavity. A plurality of wire bonds connect the semiconductor die to the second ground and an encapsulating material encapsulates the wire bonds and the semiconductor die. A ball grid array is disposed on the first surface of the substrate, bumps of the ball grid array being in electrical connection with ones of the conductive traces.

Advantageously, the semiconductor die is mounted in the cavity of the substrate, thereby reducing the wire bond length and reducing the package profile in comparison to packages in which the semiconductor die is mounted to a surface of the substrate. In one particular aspect, the die thickness is similar to the substrate thickness. The semiconductor die directly contacts the heat slug, providing efficient thermal dissipation. Also, the heat slug is exposed for mounting to a motherboard to provide further thermal dissipation.

In another aspect, a die adapter is mounted to the surface of the semiconductor die and the encapsulating material surrounds the adapter such that a surface of the adapter is exposed. The adapter provides further thermal dissipation.

In yet another aspect, the semiconductor die is electrically connected to the heat slug through wire bonds, an upper ground ring, connecting vias, and a lower ground ring. The heat slug is exposed for mounting to a motherboard so that the semiconductor die is grounded to the common ground of the motherboard.

In still another aspect, the package is stackable for reduction in motherboard area upon when mounted and to shorten the electrical signal bath between packages, thereby improving package to package communication.

BRIEF DESCRIPTION OF THE DRAWINGS

The invention will be better understood with reference to the following description and to the drawings, in which.

DETAILED DESCRIPTION OF THE PREFERRED EMBODIMENTS

Figure 1:
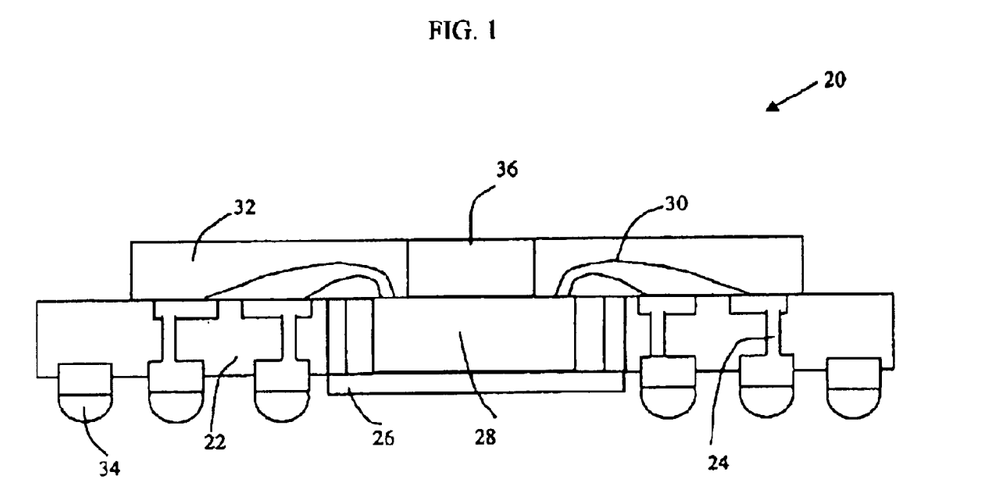
FIG. 1 is a sectional side view of a ball grid array integrated circuit package according to an embodiment of the present invention.

Reference is first made to FIG. 1 in which a partial sectional side view of a ball grid array integrated circuit package according to an embodiment of the present invention is shown. The ball grid array package is indicated generally by the numeral 20. The package 20 includes a substrate 22 having first and second surfaces and a plurality of conductive traces 24 therebetween. The substrate further has a cavity therein and a heat slug 26 is fixed to the substrate and spans the cavity. A semiconductor die 28 is mounted to the heat slug 26 such that at least a portion of the semiconductor die 28 is disposed in the cavity. A plurality of wire bonds 30 connect the semiconductor die 28 to ones of the conductive traces 24 of the substrate 22 and an encapsulating material 32 encapsulates the wire bonds 30 and the semiconductor die 28. A ball grid array 34 is disposed on the first surface of the substrate such that bumps of the ball grid array 34 are in electrical connection with ones of the conductive traces 24.

Figure 2A:
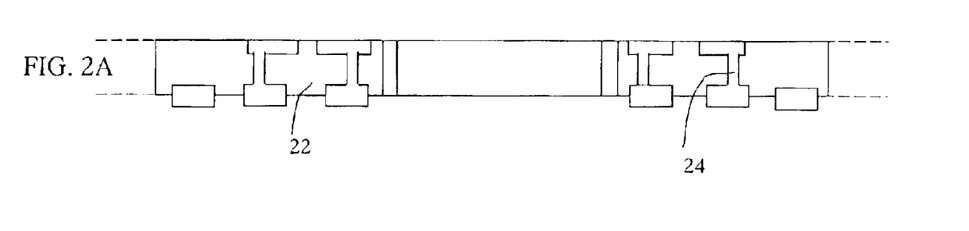
FIGS. 2A to 2H show the processing steps for manufacturing the ball grid array package of FIG. 1.

The ball grid array integrated circuit package 20 will now be described in more detail with reference to FIGS. 2A to 2H to describe the processing steps for manufacturing the ball grid array package 20, according to the first embodiment of the present invention. Referring first to FIG. 2A, the substrate 22 of a BT resin/glass epoxy printed circuit board with the conductive traces 24 for signal transfer is shown. The substrate 22 includes the cavity, which extends through the thickness of the substrate 22. A solder mask is located on the upper and lower surface of the substrate 22, with portions of the conductive traces 24 (interconnects) exposed. The substrate 22 is in the form of a strip for producing a number of BGA units. Only one such unit is depicted in FIG. 2A, portions of adjacent units being shown by stippled lines.

Figure 2B:
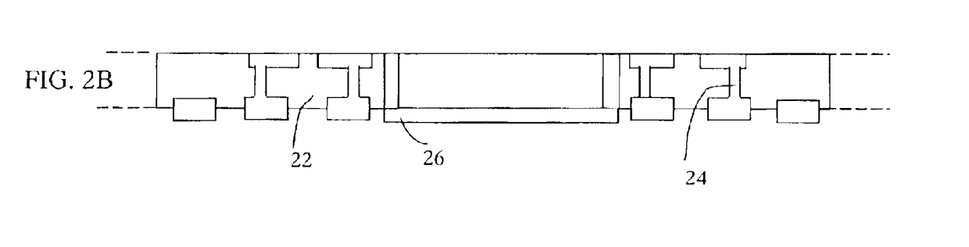

The heat slug 26, is a metal plate which is fixed to the lower surface of the substrate 22 by solder reflow methodology using pick and place technique. The periphery of an upper surface of the heat slug 26 is attached to the lower surface of the substrate 22 such that the heat slug 26 spans the cavity in the substrate 22 (FIG. 2B).

Figure 2C:
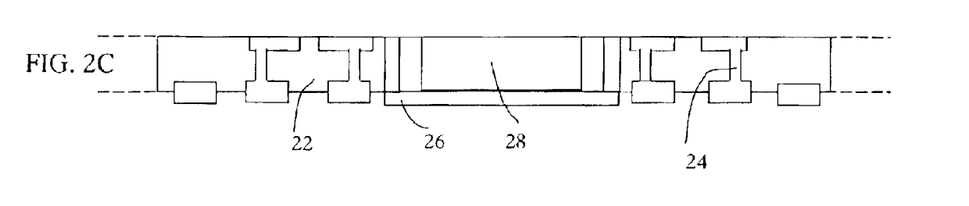
Figure 2D:
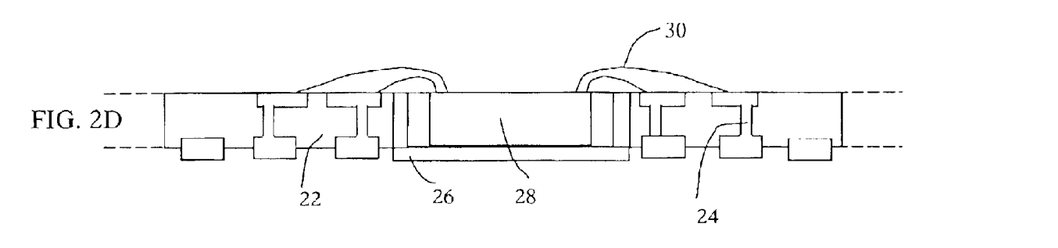

The semiconductor die 28 is conventionally mounted to the upper surface of the heat slug 26, using a die attach epoxy and the epoxy is cured (FIG. 2C). As shown in the figures, the semiconductor die 28 is mounted in the cavity of the substrate 22. The semiconductor die 28 includes a conductive pad array formed thereon and wires 30 are bonded between the conductive pads of the array and some of the conductive traces 24 of the substrate 22 using conventional wire bonding techniques (FIG. 2D). In the present embodiment, the wires 30 are gold wires, however other suitable wire materials are possible.

Figure 2E:
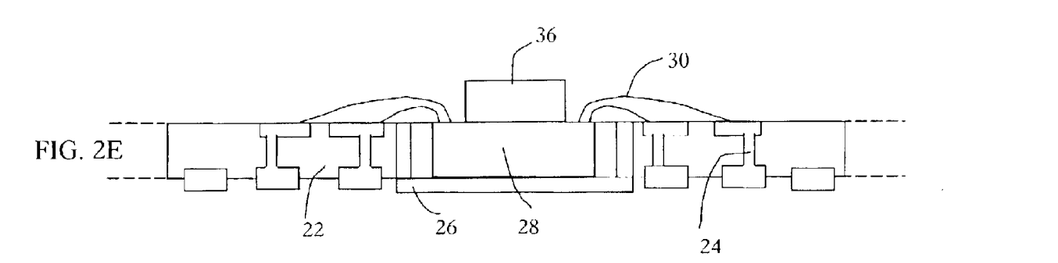

Next, an adapter 36 is mounted to a portion of the top of the semiconductor die 28 (FIG. 2E). In the present embodiment, the adapter 36 is silicon and is attached to the semiconductor die 28 using a non-conductive epoxy.

Figure 2F:
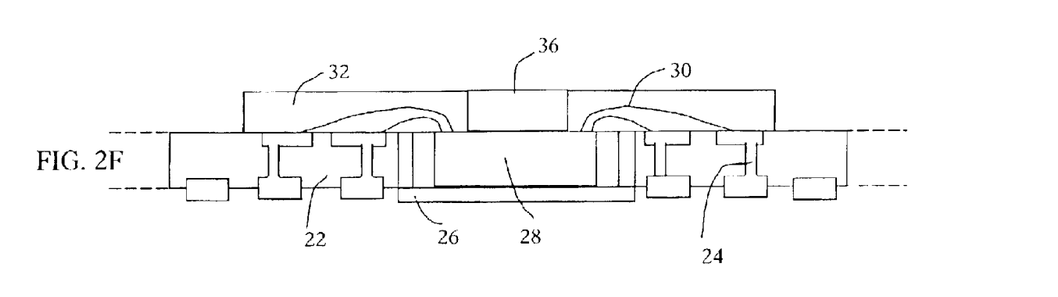

The semiconductor die 28 and wire bonds 30 are then encapsulated in an encapsulating material 32 such as a glob-top material or an overmold material. The encapsulating material 32 surrounds the wire bonds 30, the first semiconductor die 28, and surrounds all except the upper surface of the adapter 36, thereby protecting the wire bonds 30 as well as the semiconductor die 28. Thus, the upper surface of the adapter 36 is exposed for heat dissipation.

Figure 2G:
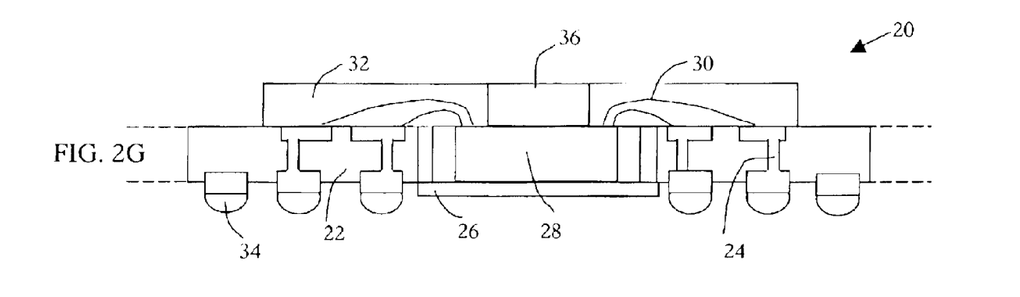

The ball grid array (BGA) 34 of solder balls, also referred to as solder bumps, is formed on the lower surface of the substrate 22 by conventional positioning (FIG. 2G). To attach the solder balls, a flux is added to the balls prior to placement and, after placement, the solder balls are reflowed using known reflow techniques. The solder balls are thereby connected to the conductive traces 24 of the substrate 22 and through the gold wires 30 to the semiconductor die 28. The solder balls provide signal and power connections as well as ground connections for the semiconductor die 28.

Figure 2H:
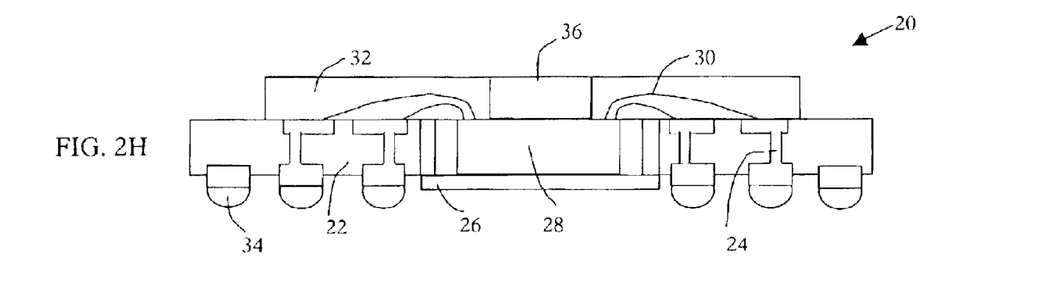

Singulation of the individual BGA units from the strip is then performed either by saw singulation or die punching, resulting in the configuration shown in FIG. 2H. Thus, the individual BGA package 20 is isolated from the strip.

Reference is now made to FIGS. 3A to 3G to describe the processing steps for manufacturing a ball grid array integrated circuit package, according to a second embodiment of the present invention. FIGS. 3A to 3D are similar to FIGS. 2A to 2D and need not be further described herein.

Figure 3A:
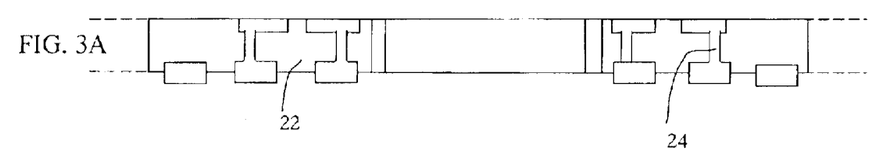
FIGS. 3A to 3G show the processing steps for manufacturing a ball grid array package in accordance with a second embodiment of the present invention.
Figure 3B:
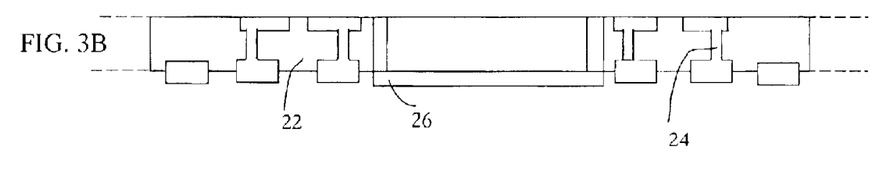
Figure 3C:
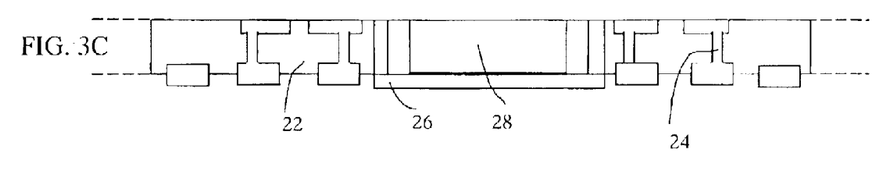
Figure 3D:
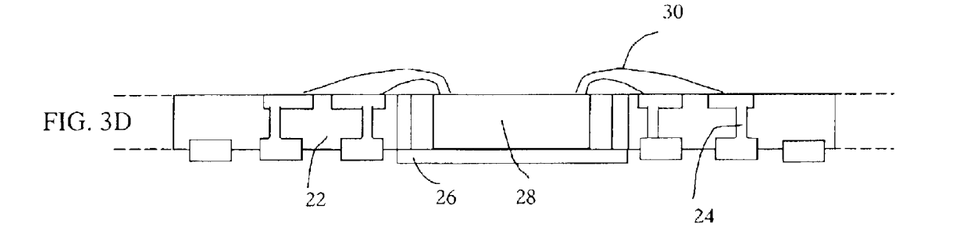
Figure 3E:
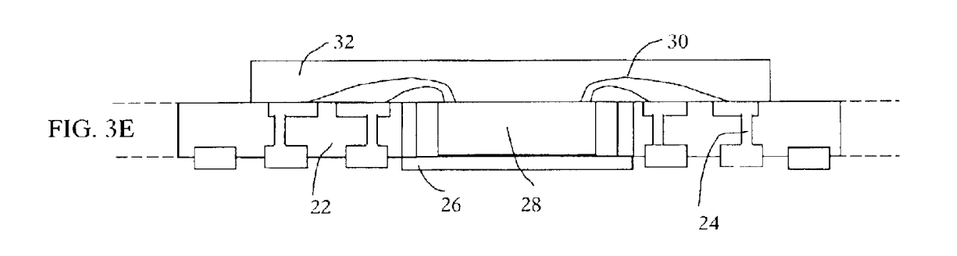
Figure 3F:
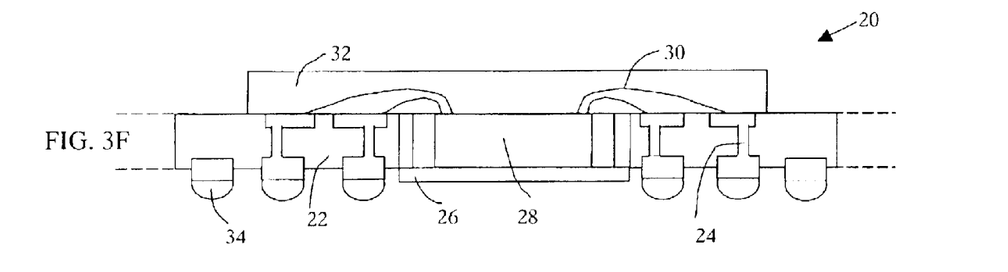

After wire bonding, the semiconductor die 28 and wire bonds 30 are encapsulated in an encapsulating material 32 (FIG. 3E). The encapsulating material 32 surrounds the wire bonds 30 and the first semiconductor die 28, thereby protecting the wire bonds 30 as well as the semiconductor die 28. Clearly there is no adapter in the ball grid array package of the present embodiment.

Figure 3G:
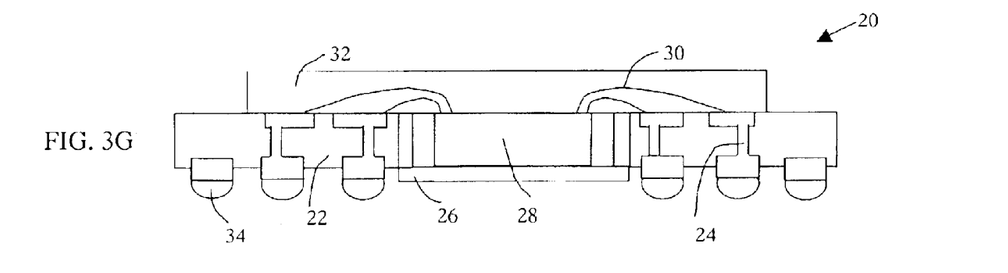

The ball grid array (BGA) 34 of solder balls, also referred to as solder bumps, is formed on the lower surface of the substrate 22 (FIG. 3F) and singulation of the individual BGA units from the strip is then performed (FIG. 3G). Thus, the individual BGA package 20 is isolated from the strip.

Reference is now made to FIGS. 4A to 4H to describe the processing steps for manufacturing a ball grid array integrated circuit package, according to a third embodiment of the present invention. FIGS. 4A to 4D are similar to FIGS. 2A to 2D and need not be further described herein.

Figure 4A:
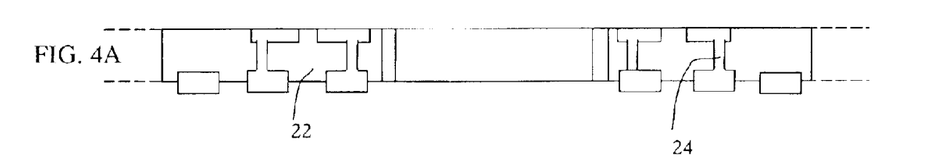
FIGS. 4A to 4H show the processing steps for manufacturing a ball grid array package in accordance with a third embodiment of the present invention.
Figure 4B:
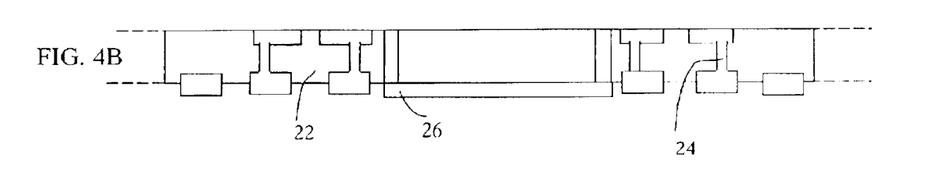
Figure 4C:
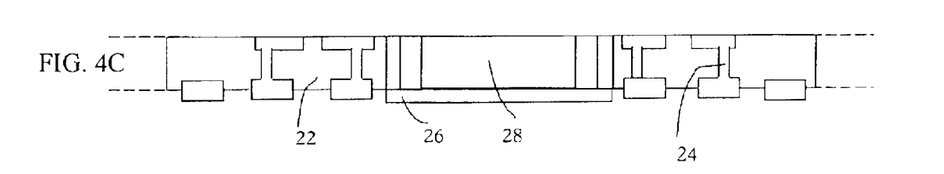
Figure 4D:
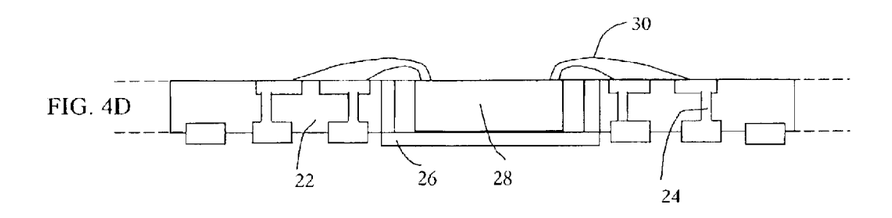
Figure 4E:
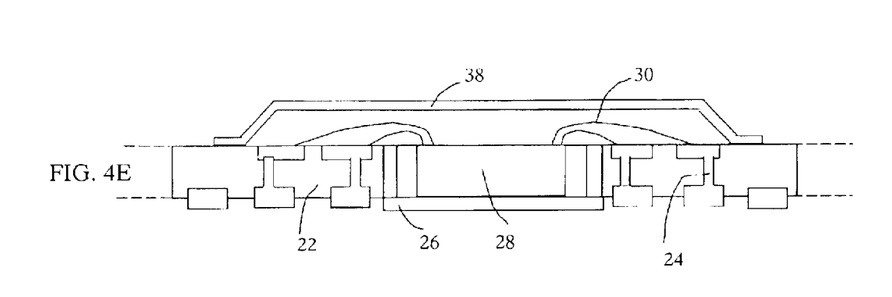

A heat spreader 38 is then fixed to the upper surface of the substrate 22 using epoxy and the epoxy is cured (FIG. 4E). The heat spreader 38 includes a substantially flat top portion with side walls that extend downwardly, as shown, into contact with ground pads on the substrate 22. The heat spreader 38 is added for heat dissipation from the top of the package 20. The heat spreader 38 is constructed of metal and includes openings to permit the encapsulating material 32 to flow therethrough.

Figure 4F:
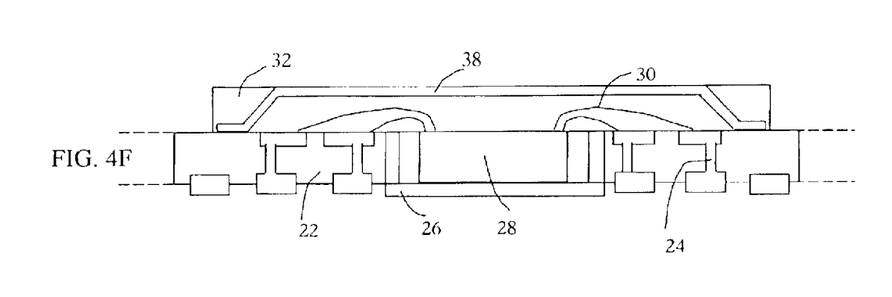
Figure 4G:
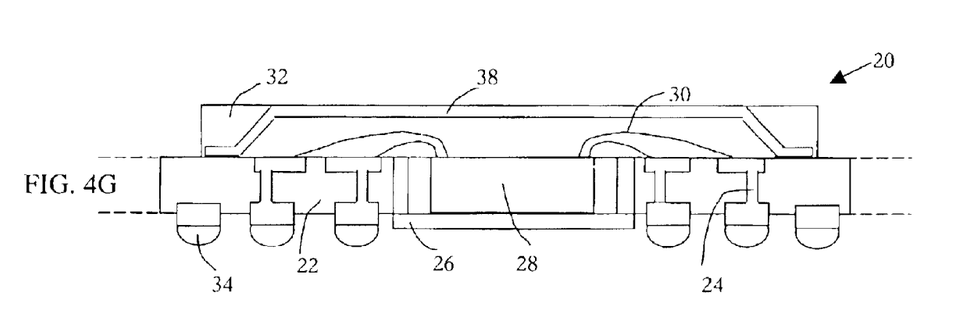

Next the semiconductor die 28 and wire bonds 30 are encapsulated in the encapsulating material 32 (FIG. 4F). The encapsulating material 32 flows through the heat spreader, surrounding the wire bonds 30 and the first semiconductor die 28, thereby protecting the wire bonds 30 as well as the semiconductor die 28. Clearly the top of the heat spreader is exposed for heat dissipation from the top of the package 20.

Figure 4H:
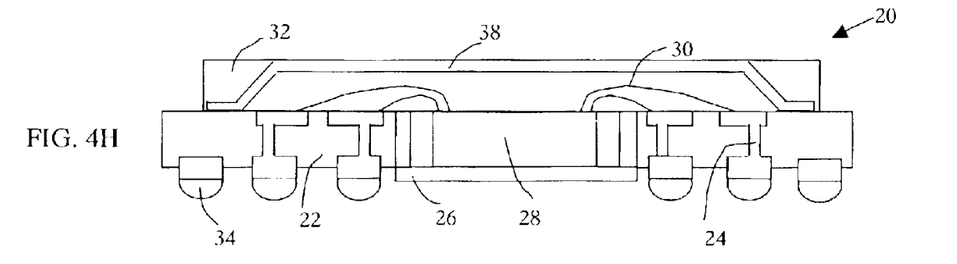

The ball grid array (BGA) 34 of solder balls, also referred to as solder bumps, is formed on the lower surface of the substrate 22 (FIG. 4G) and singulation of the individual BGA units from the strip is then performed (FIG. 4H). Thus, the individual BGA package 20 is isolated from the strip.

Reference is now made to FIGS. 5A to 5I to describe the processing steps for manufacturing a ball grid array integrated circuit package, according to a fourth embodiment of the present invention. FIGS. 5A to 5E are similar to FIGS. 2A to 2E and need not be further described herein.

Figure 5A:
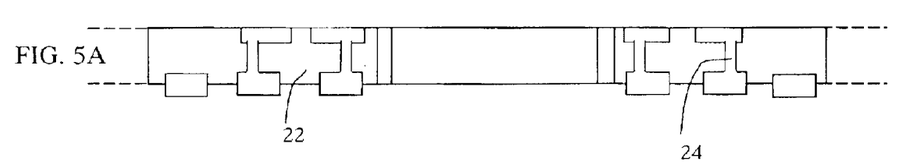
FIGS. 5A to 5I show the processing steps for manufacturing a ball grid array package in accordance with a fourth embodiment of the present invention.
Figure 5B:
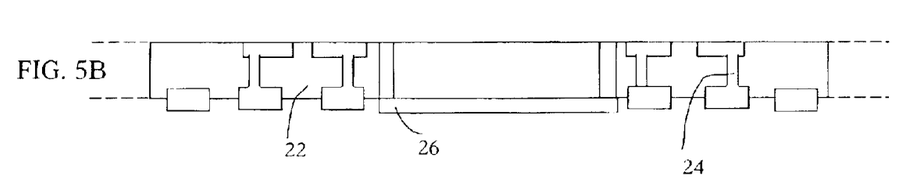
Figure 5C:
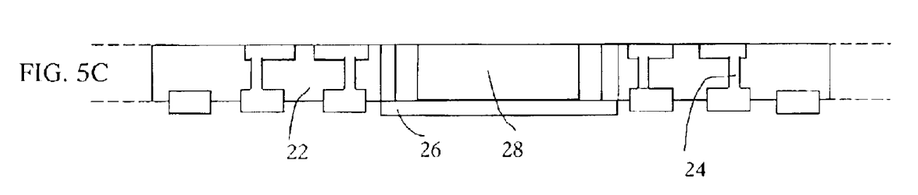
Figure 5D:
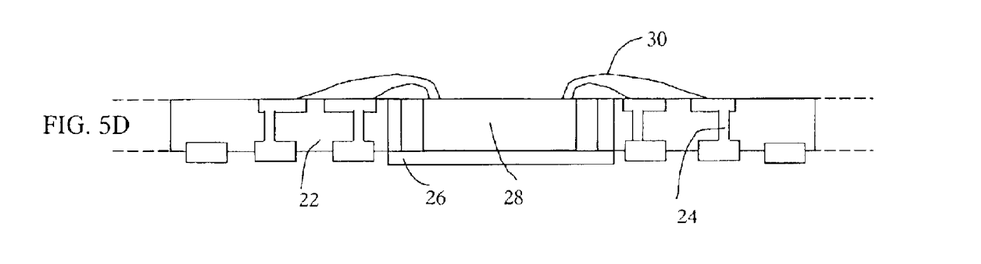
Figure 5E:
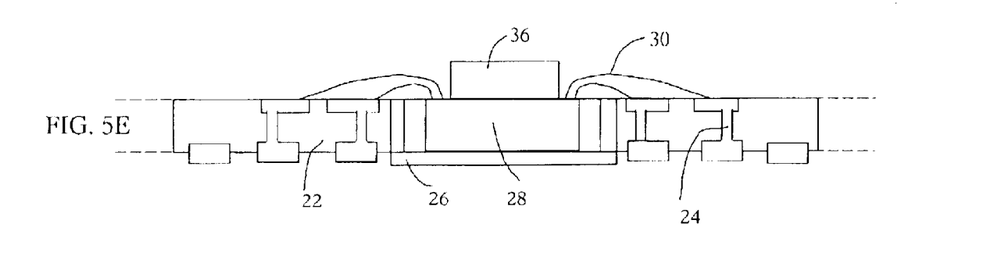
Figure 5F:
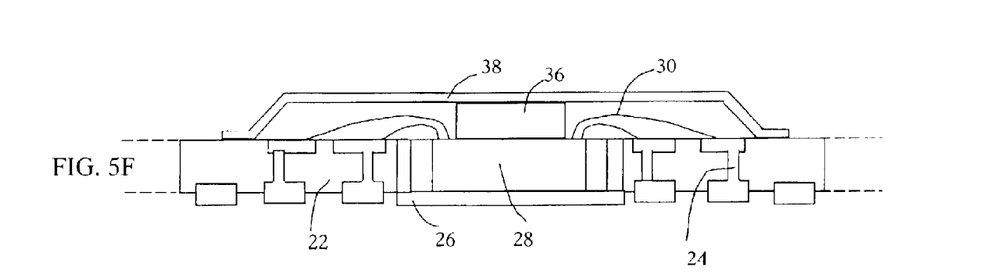

After mounting the adapter 36 to the semiconductor die 28, a heat spreader 38 is fixed to the upper surface of the substrate 22 using epoxy and the epoxy is cured (FIG. 5F). The heat spreader 38 includes a substantially flat top portion with side walls that extend downwardly into contact with ground pads on the substrate 22, as shown. In the present embodiment, the top of the heat spreader 38 contacts, and is fixed to, the upper surface of the adapter 36, to thereby provide a thermal path away from the die 28 and to the top of the package 20. As in the embodiment of FIGS. 4A to 4H, the heat spreader 38 is constructed of metal and includes openings to permit the encapsulating material 32 to flow therethrough.

Figure 5G:
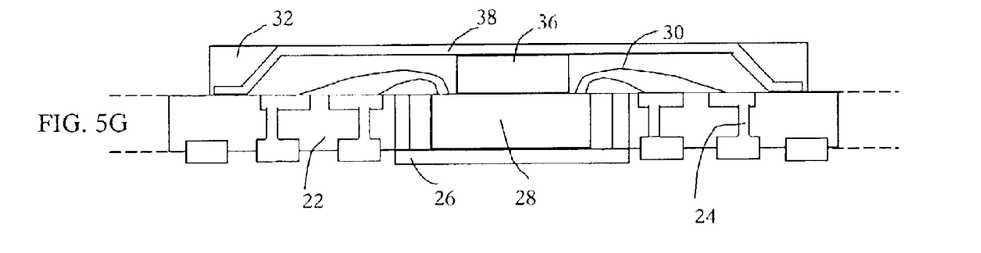
Figure 5H:
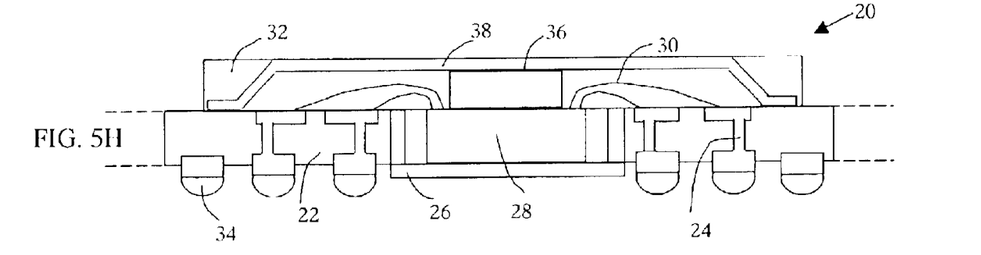

Next the semiconductor die 28 and wire bonds 30 are encapsulated in the encapsulating material 32 (FIG. 5G). The encapsulating material 32 flows through the heat spreader, surrounding the wire bonds 30, the first semiconductor die 28 and the adapter 36, thereby protecting the wire bonds 30 as well as the semiconductor die 28. Clearly the top of the heat spreader is exposed for heat dissipation from the top of the package 20.

Figure 5I:
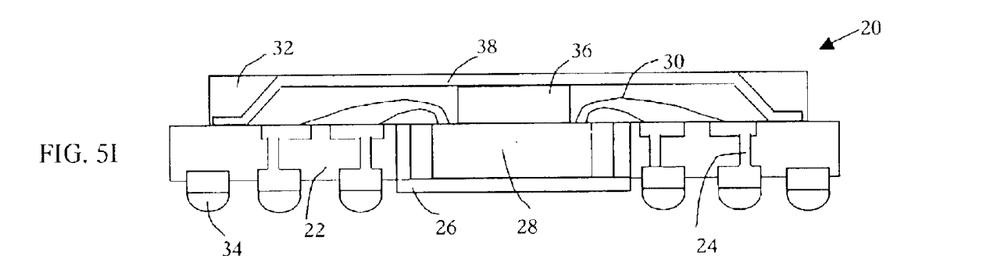

The ball grid array (BGA) 34 of solder balls, also referred to as solder bumps, is formed on the lower surface of the substrate 22 (FIG. 5H) and singulation of the individual BGA units from the strip is then performed (FIG. 5I). Thus, the individual BGA package 20 is isolated from the strip.

Figure 6:
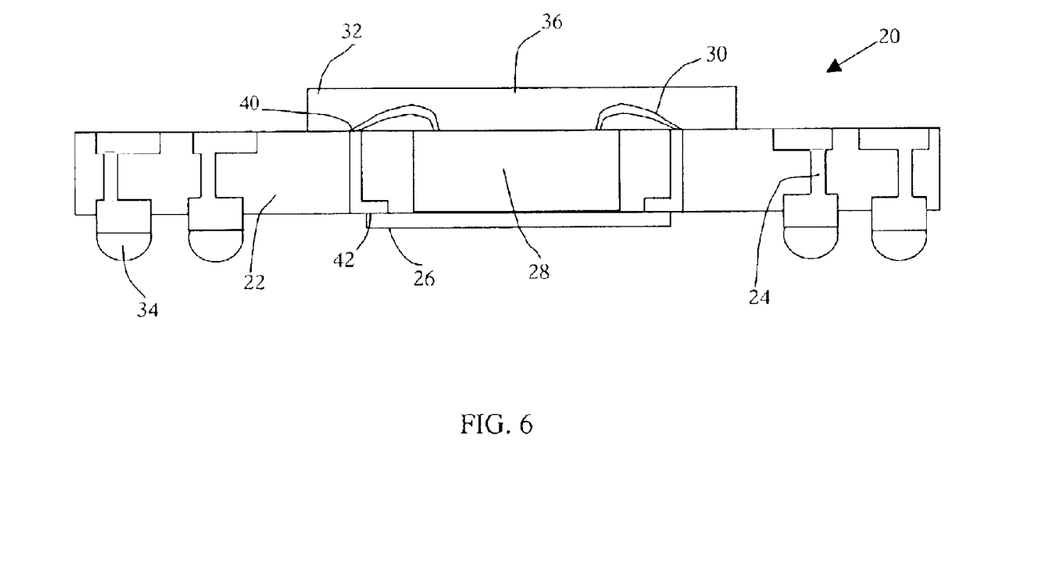
FIG. 6 is a sectional side view of a ball grid array integrated circuit package according to an alternative embodiment of the present invention.

Alternative embodiments and variations are possible. For example, FIG. 6 shows a ball grid array integrated circuit package according to an alternative to the embodiment of FIG. 3G. In the present embodiment, the substrate 22 includes an upper ground ring 40 and a lower ground ring 42, interconnected by vias. Wire bonds 30 connect the conductive pads of the array of the semiconductor die 28 and the upper ground ring 40. The heat slug 26 is connected to the lower ground ring 42 by, for example, solder or electrically conductive epoxy. Thus, the semiconductor die 28 is electrically connected to the heat slug 26 through the wire bonds 30, the upper ground ring 40, the vias and the lower ground ring 42. The heat slug 26 is coated with a suitable metal, such as silver, for solder attachment to a mother board by solder reflow. It will be appreciated that the semiconductor die 28 is grounded to the common ground of the motherboard.

Figure 7:
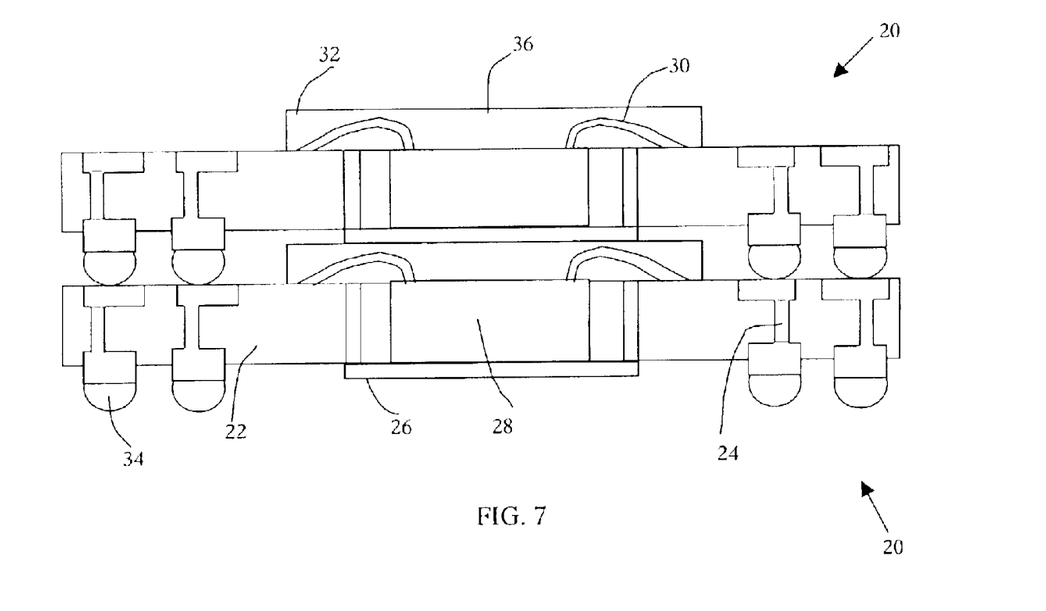
FIG. 7 is a sectional side view of a pair of stacked ball grid array integrated circuit packages according to an embodiment of the present invention.

The ball grid array package 20 can also be manufactured such that the package 20 is stackable, as shown in FIG. 7. Clearly, the packages shown in FIG. 7 are interconnected by attachment of the bumps of the ball grid array 34 of the upper package to the substrate 22 of the lower package.

Other embodiments and variations are possible. For example, the heat slug 26 shown in FIG. 2B is described as being a metal plate which is fixed to the lower surface of the substrate 22 by solder reflow methodology. The heat slug can be made of other suitable materials such as a ceramic with good thermal conductivity and can be fixed to the lower surface by electrically conductive epoxy. Other suitable adapter materials can be used, including, for example, metal and ceramic. The heat spreader 38 and the adapter 36 need not contact each other, as shown in the embodiment of FIGS. 5A to 5G, and a space can be present between the two elements. Thus the heat spreader 38 does not contact the adapter 36. Also, the size and shape of many of the elements can vary while still performing the same function. Still other embodiments and variations may occur to those of skill in the art All such embodiments and variations are believed to be within the scope and sphere of the present invention.

What is claimed is:

1. An integrated circuit package comprising:
   a substrate having opposed first and second surfaces and a plurality of conductive traces extending through said substrate between said first and second surfaces, the substrate further having a cavity extending through a thickness of the substrate;
   a heat slug fixed to said substrate and spanning said cavity;
   a semiconductor die mounted to said heat slug, at least a portion of said semiconductor die being disposed in said cavity;
   a plurality of wire bonds connecting said semiconductor die to ones of said conductive traces of said substrate;
   an encapsulating material, encapsulating said wire bonds and said semiconductor die; and
   a ball grid array disposed on said first surface of said substrate, bumps of said ball grid array being in electrical connection with ones of said conductive traces.

2. The integrated circuit package according to claim 1, wherein said heat slug is fixed to said first surface of said substrate.

3. The integrated circuit package according to claim 1, further comprising a die adapter having opposing first and second surfaces, said first surface of said die adapter being fixed to the semiconductor die.

4. The integrated circuit package according to claim 3, wherein said encapsulating material surrounds said die adapter such that said second surface of said die adapter is exposed.

5. The integrated circuit package according to claim 1, further comprising a heat spreader in contact with said substrate, said heat spreader having an exposed portion for heat dissipation from said integrated circuit package.

6. The integrated circuit package according to claim 3, further comprising a heat spreader having an exposed top portion and at least one side wall extending from said top portion, said at least one side wall being connected to said substrate.

7. The integrated circuit package according to claim 6, wherein said top portion of said heat spreader contacts said adapter.

8. The integrated circuit package according to claim 1, wherein said substrate is substantially the same thickness as said semiconductor die.

9. The integrated circuit package according to claim 1, wherein said integrated circuit package is stackable with a second integrated circuit package, such that bumps of said ball grid array of a first package connect with ones of said conductive traces.

10. The integrated circuit package according to claim 3, wherein said die adapter is comprised of one of silicon, metal and ceramic.

11. The integrated circuit package according to claim 3, wherein said die adapter is an intermetallic compound.

12. An integrated circuit package comprising:
   a substrate having a first ground on a first surface, a second ground on a second surface, conductive traces extending between said first surface and said second surface, and at least one conductive via extending between said first ground and said second ground, the substrate further having a cavity extending through a thickness of the substrate;
   a heat slug fixed to said substrate and spanning said cavity such that said heat slug is connected to said first ground;
   a semiconductor die mounted to said heat slug, at least a portion of said semiconductor die being disposed in said cavity;
   a plurality of wire bonds connecting said semiconductor die to said second ground;
   an encapsulating material encapsulating said wire bonds and said semiconductor die; and
   a ball grid array disposed on said first surface of said substrate, bumps of said ball grid array being in electrical connection with ones of said conductive traces.

* * * * *